(12) United States Patent
Chen et al.

(10) Patent No.: US 8,355,253 B2
(45) Date of Patent: Jan. 15, 2013

(54) ELECTRONIC APPARATUS WITH HEAT DISSIPATION DEVICE

(75) Inventors: Rung-An Chen, Taipei Hsien (TW); Chien-Yu Chao, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 211 days.

(21) Appl. No.: 12/975,250

(22) Filed: Dec. 21, 2010

(65) Prior Publication Data

US 2012/0099278 A1    Apr. 26, 2012

(30) Foreign Application Priority Data

Oct. 21, 2010    (TW) .............................. 99135874 A

(51) Int. Cl.
*H05K 7/20*    (2006.01)
*F28D 15/00*    (2006.01)
(52) U.S. Cl. .................. 361/700; 165/104.33; 361/695; 361/697

(58) Field of Classification Search .................. 361/697, 361/700
See application file for complete search history.

(56) References Cited

U.S. PATENT DOCUMENTS

| | | | | |
|---|---|---|---|---|
| 2008/0105410 | A1* | 5/2008 | Hwang et al. | 165/104.33 |
| 2008/0156460 | A1* | 7/2008 | Hwang et al. | 165/80.3 |
| 2008/0185129 | A1* | 8/2008 | Joshi et al. | 165/121 |
| 2009/0321058 | A1* | 12/2009 | Uchimura et al. | 165/121 |
| 2011/0277969 | A1* | 11/2011 | Chang | 165/121 |

* cited by examiner

*Primary Examiner* — Gregory Thompson
(74) *Attorney, Agent, or Firm* — Altis Law Group, Inc.

(57) ABSTRACT

An exemplary electronic apparatus includes a casing, and an electronic component and a heat dissipation device received in the casing. The casing includes a bottom plate and an opposite top plate. The heat dissipation device includes a centrifugal fan defining an air outlet for airflow out, a heat sink arranged at the air outlet, and a heat pipe. A height of the heat sink along a direction parallel to a rotation axis of the centrifugal fan is less than that of the air outlet. The heat pipe includes an evaporation section thermally attached to the electronic component and a condensation section thermally attached to the heat sink.

17 Claims, 5 Drawing Sheets

ELECTRONIC APPARATUS WITH HEAT DISSIPATION DEVICE

BACKGROUND

1. Technical Field

The disclosure relates to heat dissipation, and particularly to a heat dissipation device and an electronic apparatus using the heat dissipation device.

2. Description of Related Art

Electronic devices such as laptop computers often present a thin profile, such that interior space is very limited. Even so, the electronic device is called upon to house numerous electronic components, which results in considerable heat generated during operation. The heat frequently accumulates on a casing of the electronic device rather than being dissipated efficiently. The external surface of the electronic device can thus reach temperatures which are uncomfortable or even hazardous to a user.

What is needed, therefore, is a means which can overcome the limitations described.

DETAILED DESCRIPTION

Figure 1:
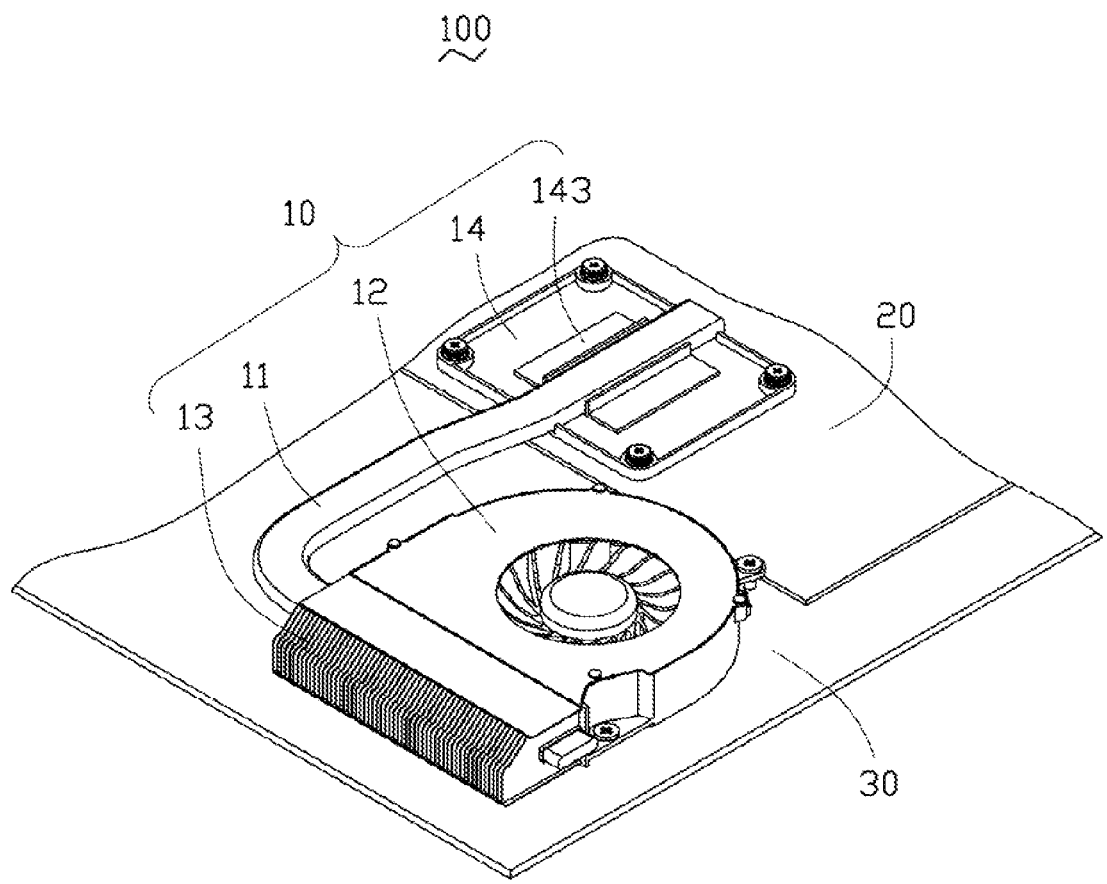
FIG. 1 is an isometric, assembled view of an electronic apparatus in accordance with an embodiment of the disclosure.

Referring to FIG. 1, an electronic apparatus 100 in accordance with an exemplary embodiment is shown. The electronic apparatus 100 includes a casing 30, and a circuit board 20 and a heat dissipation device 10 received in the casing 30.

Figure 2:
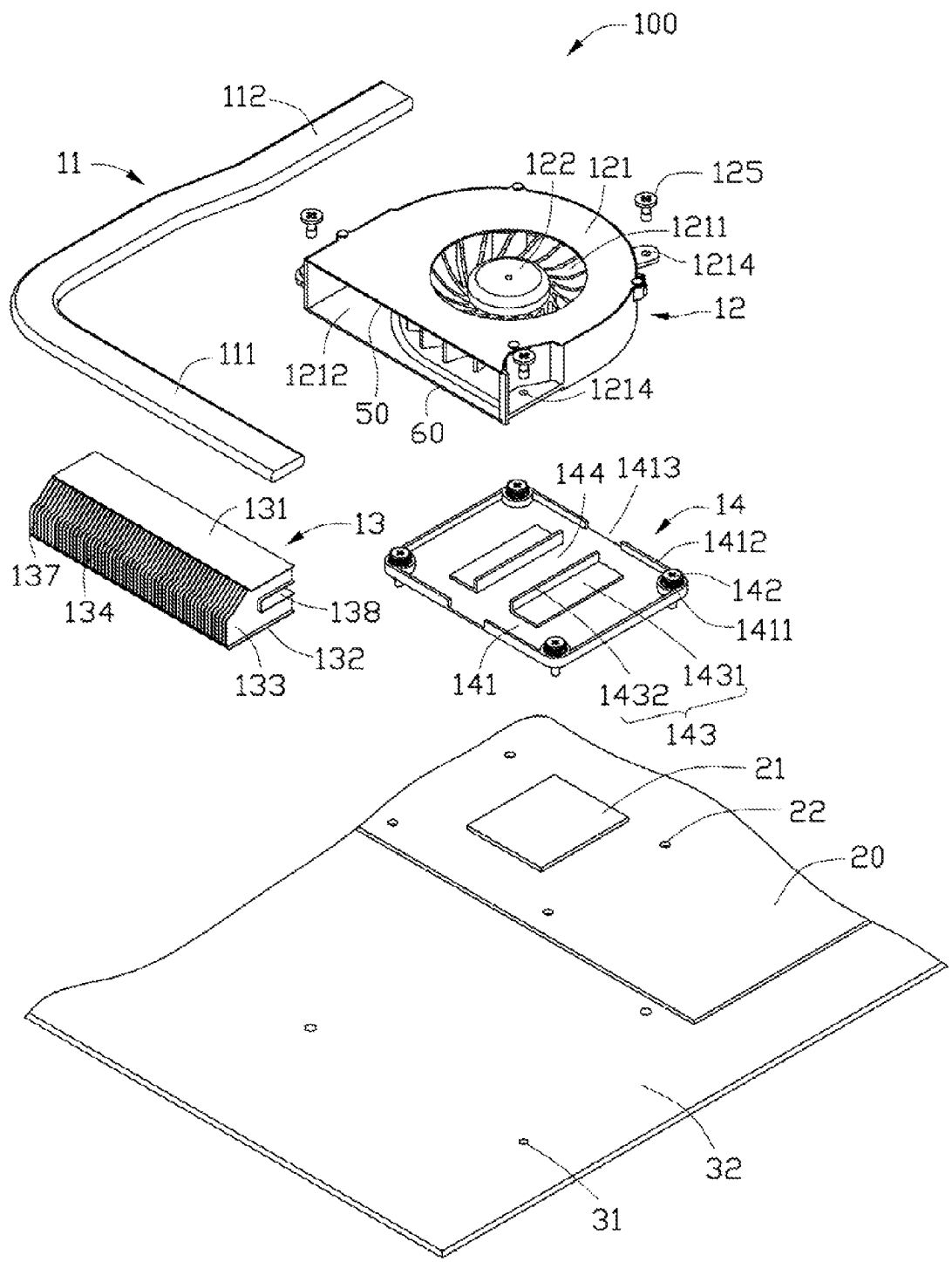
FIG. 2 is an exploded view of the electronic apparatus of FIG. 1.

Referring also to FIG. 2, the circuit board 20 is disposed over a bottom plate 32 of the casing 30. An electronic component 21, such as a central processing unit (CPU), is disposed on the circuit board 20. Four mounting holes 22 are defined in the circuit board 20 around the electronic component 21. Three fixing holes 31 are defined in the bottom plate 32 beside the circuit board 20.

The heat dissipation device 10 is adapted for cooling the electronic component 21, and includes a heat spreader 14, a heat pipe 11, a centrifugal fan 12, a heat sink 13 and two fixtures 143.

The heat spreader 14 is made of a material with high heat conductivity, such as copper, aluminum or an alloy thereof. In this embodiment, the heat spreader 14 is copper. The heat spreader 14 is flat, rectangular and thin. A flange 1412 extends up from each lateral edge of the heat spreader 14. Two cutouts 1413 are respectively defined in two opposite flanges 1412 of the heat spreader 14. In this embodiment, each cutout 1413 is generally located at a middle of the corresponding flange 1412. A width of the cutout 1413 is generally equal to a width of the heat pipe 11.

Four through holes 1411 are respectively defined in four corners of the heat spreader 14, corresponding to the mounting holes 22 of the circuit board 20. When assembled, four fasteners 142, such as four screws, extend through the four through holes 1411 of the heat spreader 14 to be received in the four mounting holes 22 of the circuit board 20, respectively, thereby fixing the heat spreader 14 on the electronic component 21. A thermal interface material (not shown) is applied between the heat spreader 14 and the electronic component 21 to eliminate air interstices therebetween, thereby enhancing heat conduction from the electronic component 21 to the heat spreader 14.

The fixtures 143 are fixedly joined to a central portion of a top side 141 of the heat spreader 14. Each of the fixtures 143 has an L-shaped cross section, and includes a connecting plate 1431 and a resisting plate 1432 extending up from the connecting plate 1431. The fixtures 143 are arranged in such a manner that the connecting plates 1431 are joined to the top side 141 of the heat spreader 14, and the resisting plates 1432 are adjacent to each other. A channel 144 is thus formed between the resisting plates 1432 for receiving the heat pipe 11. In this embodiment, the channel 144 is aligned with the cutouts 1413 of the flanges 1412 of the heat spreader 14, and has a width generally equal to that of the cutouts 1413.

The centrifugal fan 12 includes a low-profile housing 121, and an impeller 122 rotatably received in the housing 121 with a rotation axis thereof perpendicular to the housing 121. The housing 121 defines three latching holes 1214 corresponding to the fixing holes 31 of the bottom plate 32 of the casing 30, respectively. An air intake 1211 is defined in a top side of the housing 121; and an air outlet 1212 is defined at a lateral side of the housing 121, perpendicular to the air intake 1211. When assembled, the centrifugal fan 12 is disposed on the bottom plate 32 of the casing 30, with the latching holes 1214 aligned with the fixing holes 31, respectively. Three fasteners 1215 respectively extend through the latching holes 1214 to be received in the fixing holes 31, thereby fixing the centrifugal fan 12 on the bottom plate 32 of the casing 30. The air outlet 1212 of the centrifugal fan 12 is farthest away from the electronic component 21.

Figure 3:
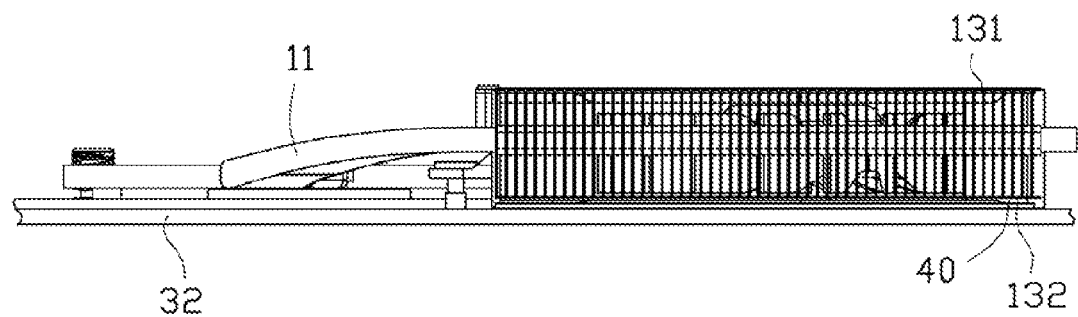
FIG. 3 is a front plan view of the electronic apparatus of FIG. 1.
Figure 4:
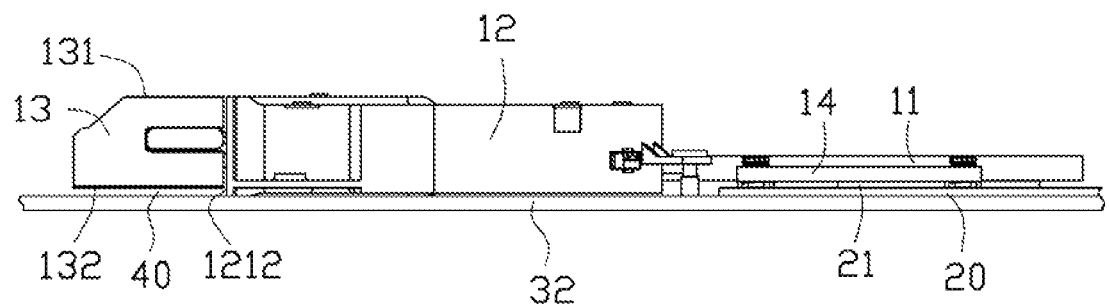
FIG. 4 is a side plan view of the electronic apparatus of FIG. 1.

Referring also to FIGS. 3 and 4, the heat sink 13 is disposed at the air outlet 1212 of the centrifugal fan 12. A height of the heat sink 13 is slightly less than that of the air outlet 1212 of the centrifugal fan 12. In this embodiment, the heat sink 13 includes a top board 131, a bottom board 132 and a fin unit 133 disposed between the top board 131 and the bottom board 132. The top board 131 and the bottom board 132 are parallel to each other. The fin unit 133 includes a plurality of fins 134. The fins 134 are generally perpendicular to the top board 131 and the bottom board 132, and are stacked along a direction parallel to the top board 131 and the bottom board 132. Each fin 134 is parallel to and spaced from a neighboring fin 134, with a passage 137 defined between each two neighboring fins 137 for the flowing through of airflow generated by the centrifugal fan 12. A U-shaped groove 138 is defined at a lateral side of the fin unit 133. When assembled, the heat sink 13 is disposed at the air outlet 1212, with the groove 138 facing the air outlet 1212. The top board 131 is generally at the same level as a top edge 50 of the air outlet 1212. The bottom board 132 is slightly higher than a bottom edge 60 of the air outlet 1212, i.e., as measured along a direction parallel to the rotation axis of the impeller 122. A narrow gap 40 is thus formed between the bottom board 132 of the heat sink 13 and the bottom plate 32 of the casing 30.

The heat pipe 11 is a sealed tube with working fluid received therein. In this embodiment, the heat pipe 11 is flat and has a generally L-shaped profile. The heat pipe 11 includes an evaporation section 112 and a condensation section 111 provided at opposite ends thereof, respectively. The condensation section 111 is received in the groove 138 of the fin unit 133 of the heat sink 13, and the evaporation section 112 is attached to the top side 141 of the heat spreader 14, thereby transferring heat from the heat spreader 14 to the fin unit 133 for dissipating. In this embodiment, the evaporation section 112 of the heat pipe 11 extends through the cutouts 1413 of the flanges 1412 of the heat spreader 14 and through the channel 144, with opposite lateral sides of the heat pipe 11 contacting the resisting plates 1432 of the fixtures 143, respectively. Thus, a heat transfer area for the heat pipe 11 is increased. Alternatively, in other embodiments, the evaporation section 112 of the heat pipe 11 can be directly connected to the electronic component 21 to absorb heat, and thus the heat spreader 14 and the fixtures 143 can be omitted.

During operation of the electronic component 21, heat is generated. The heat of the electronic component 21 is absorbed and conducted to the evaporation section 112 of the heat pipe 11 by the heat spreader 14. The working fluid thus evaporates and moves to the condensation section 111 of the heat pipe 11 to dissipate heat therefrom, and thus condenses to fluid and flows back to the evaporation section 112. The heat at the condensation section 111 is conducted to the fin unit 133, and finally dissipates to an exterior of the electronic apparatus 100 by the airflow of the centrifugal fan 12. Since there is a gap 40 formed between the casing 30 and the heat sink 13, heat on the heat sink 13 is not conducted to the casing 30, which reduces a temperature of the casing 30. In addition, airflow of the centrifugal fan 12 can flow directly through the gap 40 to cool the casing 30. Therefore, the casing 30, particularly the bottom plate 32 of the casing 30, can maintain a low temperature during use of the electronic apparatus 100.

Figure 5:
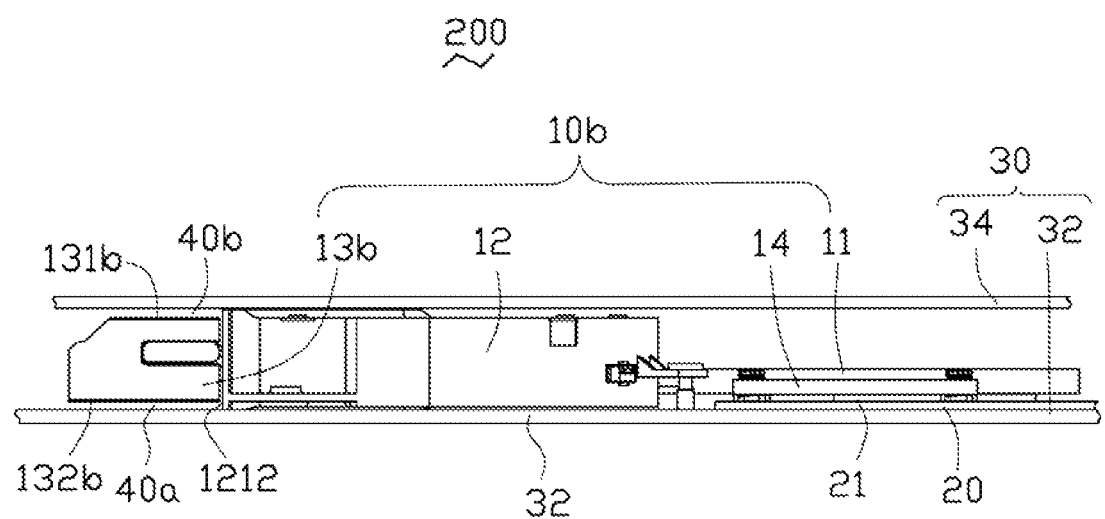
FIG. 5 is a side plan view of an electronic apparatus in accordance with an alternative embodiment of the disclosure.

FIG. 5 shows an electronic apparatus 200 according to an alternative embodiment, differing from the previous embodiment only in a heat dissipation device 10a thereof. In this embodiment, a heat sink 13b of the heat dissipation device 10b has a bottom board 132b and a top board 131b. The bottom board 132b is slightly higher than a bottom edge 60 of an air outlet 1212 of a centrifugal fan 12 of the heat dissipation device 10b. The top board 131b is slightly lower than a top edge 50 of the air outlet 1212 of the centrifugal fan 12. Thus, not only is a gap 40a defined between the heat sink 13b and a bottom plate 32 of a casing 30 of the electronic apparatus 200, but a gap 40b is also defined between the heat sink 13b and a top plate 34 of the casing 30, which increases evacuation of heat from the casing 30.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic apparatus, comprising:
   a casing comprising a bottom plate and an opposite top plate;
   an electronic component received in the casing; and
   a heat dissipation device received in the casing, the heat dissipation device comprising:
   a centrifugal fan defining an air outlet for airflow flowing out;
   a heat sink arranged at the air outlet, a height of the heat sink along a direction parallel to a rotation axis of the centrifugal fan being less than that of the air outlet; and
   a heat pipe comprising an evaporation section thermally attached to the electronic component and a condensation section thermally attached to the heat sink.

2. The electronic apparatus of claim 1, wherein the centrifugal fan is arranged on the bottom plate of the casing, and a gap is defined between the heat sink and the bottom plate of the casing for part of the airflow flowing therethrough.

3. The electronic apparatus of claim 2, wherein a bottom side of the heat sink is higher than a bottom edge of the air outlet of the centrifugal fan.

4. The electronic apparatus of claim 3, wherein a top side of the heat sink is lower than a top edge of the air outlet of the centrifugal fan.

5. The electronic apparatus of claim 4, wherein another gap is defined between the heat sink and the top plate of the casing for part of the airflow flowing therethrough.

6. The electronic apparatus of claim 1, wherein the heat sink defines a groove receiving the condensation section of the heat pipe therein, the groove facing the air outlet.

7. The electronic apparatus of claim 1, wherein the heat sink includes a top board, a bottom board, and a fin unit between the top board and the bottom board, the condensation section of the heat pipe extending through the fin unit.

8. The electronic apparatus of claim 1, wherein the heat dissipation device further comprises a heat spreader arranged between the evaporation section of the heat pipe and the electronic component.

9. The electronic apparatus of claim 8, wherein the heat dissipation device further comprises two fixtures fixed on the heat spreader and respectively engaging opposite sides of the evaporation section of the heat pipe.

10. The electronic apparatus of claim 9, wherein each fixture has an L-shaped cross section, and comprises a connecting plate fixed on the heat spreader and a resisting plate extending up from the connecting plate, the resisting plates engaging the opposite sides of the evaporation section of the heat pipe.

11. A heat dissipation device, comprising:
    a centrifugal fan defining an air outlet for air to flow out from the centrifugal fan; and
    a heat sink arranged at the air outlet of the centrifugal fan, a height of the heat sink along a direction parallel to a rotation axis of the centrifugal fan being less than that of the air outlet, and a bottom side of the heat sink being higher than a bottom edge of the air outlet.

12. The heat dissipation device of claim 11, wherein a top side of the heat sink is lower than a top edge of the centrifugal fan.

13. The heat dissipation device of claim 11, wherein a top side of the heat sink is substantially at the same level as a top edge of the centrifugal fan.

14. The heat dissipation device of claim 11, further comprising a heat pipe, the heat pipe comprising an evaporation section for absorbing heat and a condensation section attached to the heat sink.

15. The heat dissipation device of claim 14, wherein the heat sink comprises a fin unit defining a groove receiving the condensation section of the heat pipe.

16. The heat dissipation device of claim 15, wherein the groove of the fin unit faces the air outlet of the centrifugal fan.

17. The heat dissipation device of claim 15, wherein the heat sink further comprises a top plate arranged at a top side and a bottom plate arranged at said bottom side of the heat sink, the top plate of the heat sink being substantially at the same level as a top edge of the air outlet of the centrifugal fan, and the bottom plate of the heat sink being higher than the bottom edge of the air outlet of the centrifugal fan.

* * * * *